US005703144A

United States Patent [19]
Akerberg

[11] Patent Number: 5,703,144
[45] Date of Patent: Dec. 30, 1997

[54] SOLID FURAN BINDERS FOR COMPOSITE ARTICLES

[75] Inventor: Denis W. Akerberg, Lafayette, Ind.

[73] Assignee: QO Chemicals, Inc., West Lafayette, Ind.

[21] Appl. No.: 609,419

[22] Filed: Mar. 1, 1996

Related U.S. Application Data

[63] Continuation of Ser. No. 291,096, Aug. 16, 1994, abandoned.

[51] Int. Cl.[6] .................. B22C 1/02; C08K 9/04
[52] U.S. Cl. .................. 523/144; 523/215; 523/217; 524/494; 524/495
[58] Field of Search .................. 523/144, 215, 523/217; 524/494, 495

[56] References Cited

U.S. PATENT DOCUMENTS

| | | | |
|---|---|---|---|
| 2,343,972 | 3/1944 | Harvey | 528/249 |
| 3,681,420 | 8/1972 | Brown et al. | 556/424 |
| 4,243,780 | 1/1981 | Kruglikov et al. | 525/518 |
| 4,439,568 | 3/1984 | Bogner | 524/111 |
| 4,451,577 | 5/1984 | Coss | 502/167 |
| 4,543,373 | 9/1985 | Krawiec et al. | 523/144 |
| 4,694,905 | 9/1987 | Armbruster | 166/280 |

FOREIGN PATENT DOCUMENTS

| | | |
|---|---|---|
| 1200336 | 2/1986 | Canada . |
| 109710 | 4/1982 | Poland . |

OTHER PUBLICATIONS

Abstract: CA97(4): 24672Z, 1982.
Abstract: CA98(2): 5046c, 1982.
Pp. 59–61 of paper presented at "Wood Adhesives Research, Applications, and Needs" Symposium held at Madison, Wisconsin on Sep. 23–25, 1980.

*Primary Examiner*—Vasu Jagannathan
*Assistant Examiner*—John J. Guarriello
*Attorney, Agent, or Firm*—Woodard, Emhardt, Naughton, Moriarty & McNett

[57] ABSTRACT

Furfuryl alcohol-formaldehyde resins in solid form.

24 Claims, No Drawings

SOLID FURAN BINDERS FOR COMPOSITE ARTICLES

This application is a continuation of application Ser. No. 08/291,096, filed Aug. 16, 1994, now abandoned.

This invention relates to furan-formaldehyde resins which are useful as binders for composite articles.

Resinous furan-formaldehyde condensation products which when cured or set are useful as binders in the manufacture of composite articles such as wood particle boards, wafer board, oriented fiber board, matboard, hardboard, pressboard, various fiberglass articles and the like, and in the manufacture of low density non-molded composite articles such as acoustical tile and thermal insulating mats or boards, or to form insulation batting from glass fibers.

Another application in which furan-formaldehyde resins are widely used is in metal foundries for making shapes of all sorts for foundry purposes, including sand shapes which are to be used as mold cores, sand shapes useful in other casting processes, including sand shapes which are made in patterns and cured therein as well as free standing sand shapes which may be cured in conventional ovens or in microwave ovens for any desirable purpose in foundry work. Furan-formaldehyde resins have also wide applicability as binders not only in the metal founding art but also in other applications such as for the production of carbon seals, carbon vanes, carbon electrodes and reclaimed coke.

Heretofore, furan-formaldehyde resins have been shipped in their natural liquid state to the user locations where they are applied to a substrate to form the composite articles. Shipping liquids presents problems in handling and is costly with respect to liquid containers and space requirements. Accordingly, it is desired to have in solid form furan-formaldehyde resins useful as binder compositions.

The present invention provides resin compositions for producing shaped composite articles comprising a furfuryl alcohol-formaldehyde resin in solid form which is curable to a rigid set condition.

The present invention also provides solid binder compositions comprising furfuryl alcohol-formaldehyde resin in solid form combined with a substrate material.

The present invention provides processes for producing resin compositions in solid particulate form which are curable to a rigid set condition.

The present invention also provides processes for producing resinous binder compositions in solid form which upon curing in a shaping element with a substrate material form a bound shaped article.

It has now been found that certain furfuryl alcohol-formaldehyde resins can be produced in substantially dry, solid form. The dry solid resins can be produced in particulate form, combined with a substrate material and then cured to a set condition to form a bound rigid article.

The furfuryl alcohol-formaldehyde resins useful according to this invention at the present time are disclosed in copending U.S. application Ser. No. 08/176,341 filed Dec. 29, 1993 by George S. Everett, George R. MacLennan and Michael C. Chen. The furan-formaldehyde resins disclosed in that copending application are furfuryl alcohol-formaldehyde resins which are highly compatible or dilutable with water and are very advantageous for use as binders for composite materials. These resins are characterized as exhibiting very high compatibility with water and when diluted with an excess amount of water 90% or more, preferably at least 95%, of the resin is soluble in the water, i.e. the resin contains not more than 10% by weight of water-insoluble materials. For example, when 5 grams of resin is added to 95 grams of water, at least 4.5 grams of the resin is soluble in the water. The high water compatibility of those resinous compositions is advantageous in that undesirable amounts of resin need not be discarded prior to use as a binder and greatly improved resin distribution on a composite substrate can be achieved with the resins having high water compatibility.

As used in the said copending application, the term "Water Insolubles" means the amount of residue (or solids) which settles out, after standing at least 8 hours in water, when 5.0 grams resin is added to 95.0 grams deionized water. The percentage of water insolubles can be calculated by the formula:

$$\% \text{ Water Insolubles} = \frac{\text{Weight of Residue}}{5.0 \text{ grams resin}} \times 100\%$$

and the term "Water Compatibility" means the amount of resin that is soluble, after standing at least 8 hours in water, when 5.0 grams of resin is added to 95.0 grams deionized water. The percentage of water compatibility can be calculated by the formula:

$$\% \text{ Water Compatibility} = \frac{5.0 \text{ grams resin} - \text{weight of residue}}{5.0 \text{ grams resin}} \times 100\%$$

As can be seen, there is an inverse relationship between water compatibility and water insolubles—the lower the amount of water insolubles, the greater the water compatibility.

In accordance with this invention, a furfuryl alcohol-formaldehyde resin of the above type, which is produced in liquid state, is heated to remove substantially all of the water from the resin. Heating is conducted at temperatures on the order of 100° to 120° C. to remove substantially all of the water from the resin. Removal of water from the liquid resin can be accomplished by heating the resin itself in a suitable container to form a substantially dry solid mass upon cooling. The solid resin mass can then be flaked, ground or pulverized to form particles of a desired size for convenience in handling and shipping and use as a binder for composite articles. The particle size of the solid resin can vary widely depending primarily upon the substrate with which it will be ultimately used as a binder.

Alternatively, before removal of water from the resins the liquid resin can be admixed with a substrate material and the admixture heated to remove water and convert the resin to solid state. In such manner, a "concentrate" binder composition can be produced for later incorporation with additional composite materials to form a composite article. For such a "concentrate" binder the resin is applied to a carrier substrate in an amount sufficient to exert an effective binding action when used to form the final composite article. A binder "concentrate" can be produced by combining the resin with a carrier substrate or aggregate material such as silica sand, carbon particles, fiberglass, silicon carbide, graphite, wood chips and the like. Those skilled in a particular art can routinely determine the amount of resin required to produce a desired composite product. Preferably, an excess of the furan resin is used to form the dry solid binder "concentrate" so that the composition can be admixed with additional amounts of a composite material to form the final article. Likewise, the solid resin by itself can be distributed over a substrate material to form a final composite bound article upon curing of the resin to a thermoset condition.

Similarly, a liquid furfuryl alcohol-formaldehyde resin can be used to impregnate a porous substrate material such as paper and the impregnated paper then heated to remove water from the resin. The dried impregnated paper can then be later utilized to form articles such as filters or printed circuit boards by subjecting the resin impregnated paper to resin curing conditions.

The present invention and the advantages thereof will be further shown by reference to the following examples.

EXAMPLE 1

This example illustrates the preparation of a preferred resinous binder composition using 2.75 moles of formaldehyde per mole of furfuryl alcohol. 1,146.4 pounds of furfuryl alcohol (11.70 pound moles), 1,050.0 pounds of paraformaldehyde (91–93% purity; 32.18 pound moles), 9.3 pounds sodium hydroxide (50% aqueous), and 171.9 pounds of adipic acid were charged to a 350 gallon reactor. This mixture was agitated at 84°–86° C. and 5–10 psi for 4 hours to insure the paraformaldehyde was in solution. The mixture was heated to 110° to 116° C. and 14–23 pounds per square inch and held for 3.1 hours until the percent furfuryl alcohol had been reduced to 1.8%. The product was then cooled to 60° C. and 252 pounds of 50% aqueous urea solution was added. This mixture was allowed to cook for one hour at 65° C. at which time 237 pounds of 28–30% aqueous ammonia (3 weight percent of the resin) was added. The total product was then allowed to cook for four hours at 86°–92° C. and 8–50 pounds per square inch. The product was then cooled to 30° C. and drummed through a 50 micron filter. The analysis of the resin is given below.

| % furfuryl alcohol | % water insoluble | % free formaldehyde | % BHMF | % water | viscosity | pH |
|---|---|---|---|---|---|---|
| 0.17 | 0.16 | 0.68 | 12.6 | 25.3 | 650 cps | 4.8 |

EXAMPLE 2

2.5 grams of the resin as prepared in Example 1 containing approximately 25% water was applied to 100 grams of glass shot. The mixture was heated at 200° F. until the calculated amount of water was removed and the mixture formed a solid mass. The solid mass was cooled to room temperature and broken up. A dry, free flowing particulate mixture of resin and glass shot resulted. After four days at room temperature, the particulate mixture was formed and pressed into a one inch thick dog bone tensile biscuit. The biscuit was cured one hour at 400° F. The cured biscuit was placed in a machine adapted to determine what the tensile and ultimate yield strengths are of the part thus formed. The tested cured dog biscuit had a tensile strength of 365 pounds per square inch.

The dog bone biscuits are generally in the shape of an hour glass with the ends of the biscuits being approximately 1.5 inches across and the center section being 1.0 inch across. The thickness of the biscuits can be one-quarter inch, one-half inch, or one inch, depending on the type of test being performed. The biscuits are prepared from the above mixes by placing the mix into twelve cavity "gang" molds. The mixes are then hand tamped to insure uniformity and screeded to the mold height. The uncured biscuits are then removed from the mold, placed on a metal plate, and put in an oven to cure. The time and temperature used to cure the biscuits will depend on the biscuit thickness, catalyst used, and the particular test being run. Once cured, the biscuits are removed from the oven and allowed to cool to ambient temperature. At this point some of the biscuits could be subjected to preliminary tests, such as a water soak or boil, before tensile testing is conducted. The tensile tests are conducted at ambient temperature using a Detroit Testing Machine Company tensile tester model CST. This machine is equipped with a set of "jaws" of sufficient size and shape to hold the biscuits firmly in place. The bottom "jaw" is fixed in place while the upper "jaw" moves in an upward motion exerting a tensile force on the biscuits. This force is applied at a controlled rate and the load pounds needed to fracture the biscuit s is digitally recorded. A set of six biscuits are normally used to determine the average tensile strength within a given test parameter.

EXAMPLE 3

A liquid furan-formaldehyde resin as prepared in Example 1 in a container is heated in an air circulating oven at a temperature of approximately 240° F. for 2 hours. Upon cooling the resin in the form of a dry solid mass is broken up or ground to provide a dry, free-flowing particulate solid which can then be shipped to a user location for use as a binder in the manufacture of composite articles.

EXAMPLE 4

A dry, particulate solid furfuryl alcohol-formaldehyde resin as prepared in accordance with Example 3 is mixed with silica sand so as to distribute the resin throughout the sand particles. Ammonium nitrate catalyst in an amount of about 5% by weight of resin is distributed throughout the sand-resin mix. The mixture of resin, catalyst and sand is then placed into a mold in the shape of a foundry core. The mold and its contents are then heated to a resin curing temperature of about 420° F. for 2.1 hours. The sand core is removed from the mold and is ready for foundry use.

EXAMPLE 5

A liquid resin as prepared in Example 1 was distributed over silica sand particles. Approximately 2 parts by weight of the resin is applied to 1 part of the sand. The admixture is then heated in a circulating air oven to a temperature of 250° F. for a period of 3 hours. Upon cooling the sand-resin mass is broken up to form particles of a binder "concentrate". This "concentrate" can then be later used in metal founding operations with additional sand to form shaped foundry sand elements.

EXAMPLE 6

The procedure of Example 5 is followed except fiberglass is utilized in lieu of sand and composite fiberglass articles are produced using the fiberglass-resin concentrate.

EXAMPLE 7

163.8 pounds of furfuryl alcohol (1.67 pound moles), 150.0 pounds of paraformaldehyde (91–93% purity; 4.59 pound moles), 1.32 pounds sodium hydroxide (50% aqueous), and 12.28 pounds of adipic acid were charged to a 50 gallon reactor. This mixture was agitated and heated to 120° C. over a one-hour period. This mixture was reacted under pressure at this temperature until the percent furfuryl alcohol had been reduced to 3.8%. The product was then cooled to 30° C. and packaged through a 10 micron filter. 18.0 kilograms of this product was charged to a 22 liter round bottom glass flask equipped with agitation and a condenser. The product was heated to 60° C. and 1.908 kilograms of 50% aqueous urea solution was added. This mixture was allowed to cook for one hour at 65° C. at which time 1.260 kilograms of 28-30% aqueous ammonia was added. The total product was then allowed to cook for two hours at 90° C. The product was then cooled and packaged. The analysis of the resin is given below.

| % furfuryl alcohol | % water insoluble | % free for- maldehyde | % BHMF | % water | viscosity | pH |
|---|---|---|---|---|---|---|
| 1.29 | 0.20 | 3.46 | 25.19 | 21.17 | 421 cps | 5.06 |

EXAMPLE 8

A liquid resin containing approximately 21.17% water prepared as in Example 7 and carbon particles are thoroughly blended. The admixture is then heated in an oven at a temperature of 230° F. for 3 hours to drive off the water. The cooled carbon-resin mixture in the form of a bound solid mass is then broken up to provide a dry, free-flowing particulate solid.

The free-flowing particulate solid material is later placed into a preheated (60°-65° C.) extruder and extruded through a die into rods. The green carbon rods are baked and thoroughly carbonized by baking in a programmed atmosphere with a programmed temperature rise to 650° C. and holding at that temperature for 48 hours. When carbonized the rods have characteristics suiting them for use as electrodes.

The present invention provides numerous advantages in that it provides a solid resin which can be conveniently used as a binder for composite articles. Among the advantages of a solid resin over a liquid resin are reduced shipping and handling costs, ease of storage, reduced waste disposal costs (shipping containers) and process adaptability.

Those modifications and equivalents which fall within the spirit of the invention are to be considered a part thereof.

What is claimed is:

1. A solid dry resin composition heat curable to a rigid set condition comprising the reaction product of formaldehyde with furfuryl alcohol in a molar ratio of at least 2:1, the composition containing not more than 10% by weight of water insoluble material and not more than about 5% by weight of furfuryl alcohol.

2. A resin composition in accordance with claim 1 comprising the reaction product of formaldehyde with furfuryl alcohol in a molar ratio of about 2.75:1.

3. A resin composition in accordance with claim 1 comprising the reaction product of formaldehyde with furfuryl alcohol in a molar ratio of about 3.50:1.

4. A resin composition in accordance with claim 1 wherein the resin contains not more than about 5% by weight of water insoluble material.

5. A composition in accordance with claim 1 in particulate form.

6. A binder composition for composite articles comprising a particulate substrate material having admixed therewith a resin composition in accordance with claim 1.

7. A binder composition in accordance with claim 6 wherein the substrate material is sand.

8. A binder composition in accordance with claim 6 wherein the substrate material is fiberglass.

9. A binder composition in accordance with claim 6 wherein the substrate material is carbon.

10. A process for producing a bound composite article which comprises admixing with a particulate substrate material a resin in accordance with claim 1, curing the resin to a set condition, and recovering a bound composite article.

11. A process in accordance with claim 10 wherein the particulate substrate material is sand.

12. A process in accordance with claim 10 wherein the particulate substrate material is fiberglass.

13. A process in accordance with claim 10 wherein the particulate substrate material is carbon.

14. A process for producing a bound composition article which comprises:

a. impregnating a porous substrate material with a liquid resin comprising the reaction product of formaldehyde with furfuryl alcohol in a molar ratio of at least 2:1, the resin containing not more than 10% by weight of water insoluble material and not more than about 5% by weight of furfuryl alcohol, b. removing water from the impregnated material to obtain a solid dry resin, and c. curing the resin in the impregnated material to a set condition.

15. A process for producing a solid dry resin composition heat curable to a set condition which comprises:

a. reacting in the presence of a weak organic acid having a pKa of not less than about 4 at an elevated temperature formaldehyde with furfuryl alcohol in a molar ratio of at least about 2:1, b. recovering the liquid resin reaction product, the liquid resin reaction product containing not more than 10% by weight of water insoluble material, c. removing water from the liquid resin reaction product, and d. recovering the solid dry reaction product.

16. A process in accordance with claim 15 wherein the resin is the reaction product of formaldehyde with furfuryl alcohol in a molar ratio of about 2.75:1.

17. A process in accordance with claim 15 wherein the resin is the reaction product of formaldehyde with furfuryl alcohol in a molar ratio of about 3.50:1.

18. The composition of claim 1 containing not more than about 5% by weight of water insolubles.

19. The composition of claim 1 comprising the reaction product of furfuryl alcohol with formaldehyde in the presence of a weak organic acid having a pKa of not less than about 4.

20. The composition of claim 1 and which contains not more than about 0.5% by weight of formaldehyde.

21. The composition of claim 20 comprising the reaction product of furfuryl alcohol with formaldehyde in the presence of a weak organic acid having a pKa of not less than about 4.

22. The resin composition of claim 1 which is in a particulate, free-flowing form.

23. The process of claim 15 and which further includes the step, after recovering the solid product, of further processing the solid product to produce a particulate, free-flowing dry resin composition.

24. The process of claim 23 in which the further processing step comprises flaking, grinding or pulverizing the recovered solid reaction product to produce the particulate, free-flowing resin composition.

\* \* \* \* \*